United States Patent [19]
Rogers et al.

[11] Patent Number: 5,177,856
[45] Date of Patent: Jan. 12, 1993

[54] METHOD OF MAKING A SHIELD FOR A PRINTED CIRCUIT BOARD

[75] Inventors: Steven A. Rogers, Leesburg; George Bockelmann, Vienna; Gary Hester, Sterling, all of Va.

[73] Assignee: Cryptec, Inc., Va.

[21] Appl. No.: 697,443

[22] Filed: May 9, 1991

Related U.S. Application Data

[62] Division of Ser. No. 473,635, Feb. 1, 1990, Pat. No. 5,043,848.

[51] Int. Cl.⁵ .............................................. B23P 13/04
[52] U.S. Cl. ..................................... 29/557; 156/664; 156/645
[58] Field of Search ............... 29/557, 558; 174/35 R, 174/51; 156/645, 664; 361/424

[56] References Cited

U.S. PATENT DOCUMENTS
4,743,956  5/1988  Olla et al. ............................ 156/645

FOREIGN PATENT DOCUMENTS
0046022  2/1982  European Pat. Off. ............. 29/558

*Primary Examiner*—P. W. Echols
*Attorney, Agent, or Firm*—Cushman, Darby & Cushman

[57] ABSTRACT

An improved shielding assembly for a circuit board. This assembly is formed by providing a substantially flat piece of metal that will be used to form a shield assembly. A template is obtained indicating locations of folds and tabs. The folds are at locations that will enable the tabs to be located in the holes on the circuit board. The template is used to etch grooves and to etch tabs. This can be used to form a shielding assembly.

3 Claims, 4 Drawing Sheets

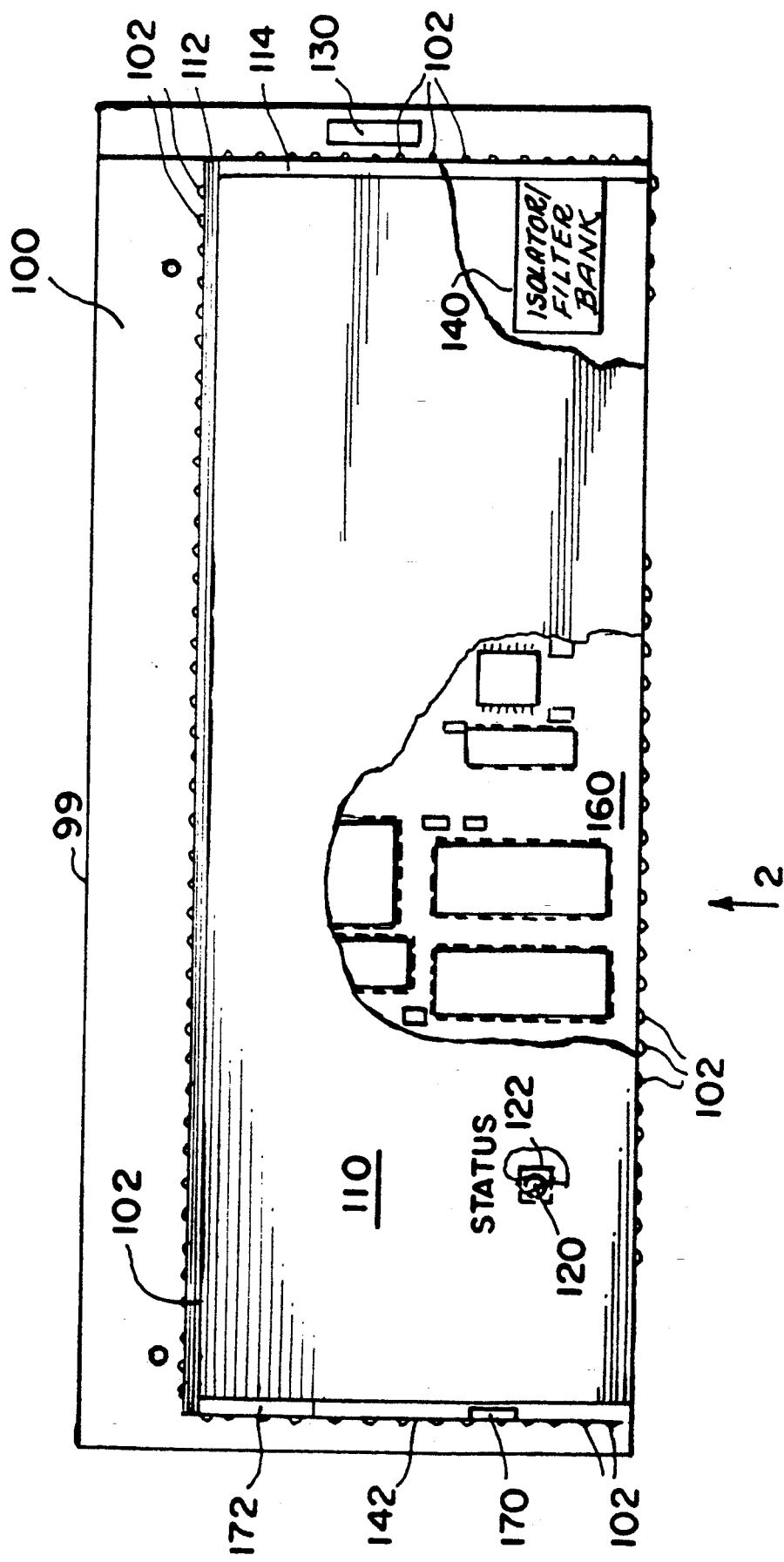

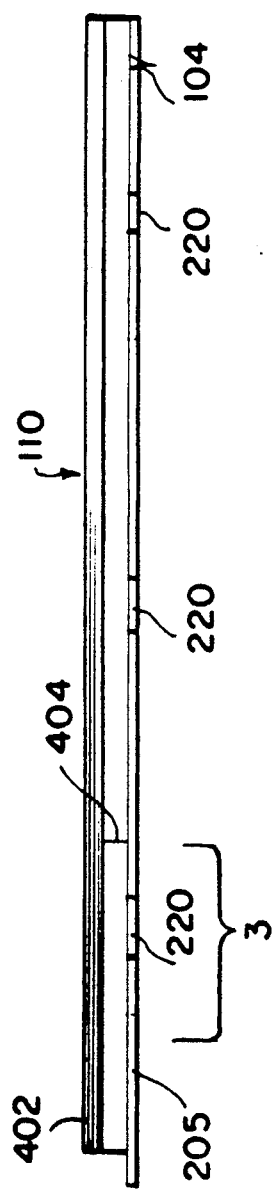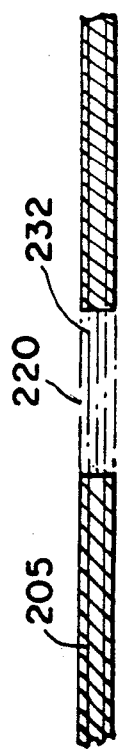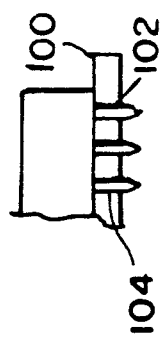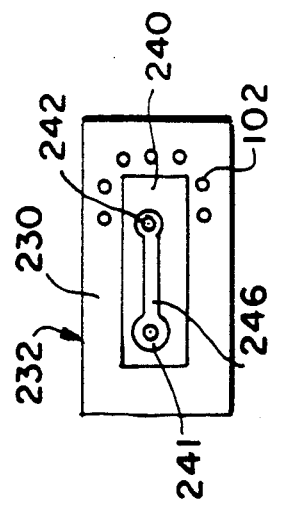

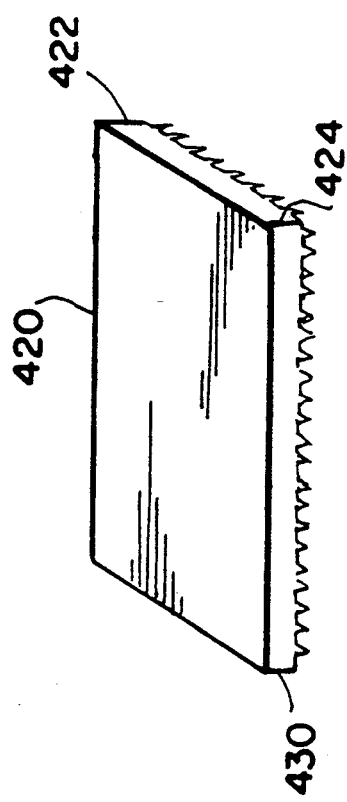
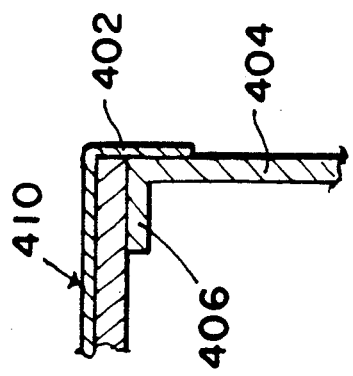
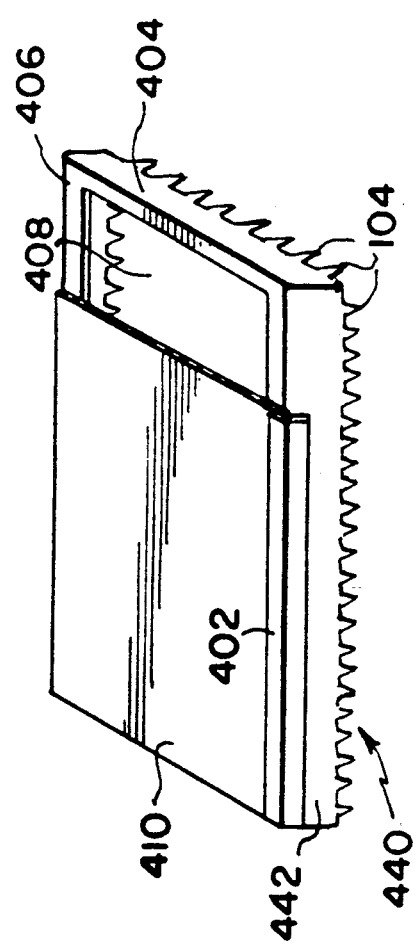

METHOD OF MAKING A SHIELD FOR A PRINTED CIRCUIT BOARD

This is a division of application Ser. No. 07/473,635, filed Feb. 1, 1990 now U.S. Pat. No. 5,043,848.

FIELD OF THE INVENTION

The present invention relates to a shielded printed circuit board which provides maximum shielding to the circuit on the board and which is formed in a completely new way.

BACKGROUND OF THE INVENTION

Electronics have become more miniaturized and sophisticated in recent years. However, along with sophistication and miniaturization comes the necessity for better noise shielding.

Noise immunity is extremely important in printed circuit boards for use in communication equipment. Crucial parts of the board must be shielded against noise and RF interference. Shielding also provides some immunity from unauthorized reception by sophisticated surveillance equipment. The perfect shield might be a grounded, sealed box, covering the whole unit. However, this would not allow for power signal access and therefore would not be a usable assembly.

Another necessary attribute of modern circuit boards are that they be of the multi-layer type, in order to facilitate multiple connections between various components. Multi-layer circuit boards have a plurality of layers, each of which is formed with a number of traces. The components on the board face are connected with one of the layers, and therefore connected by the traces on that layer and the traces on no other layers. Each of these layers also has a ground plane.

One standard way of shielding against noise has been to provide a ground plane. Such a ground plane enables ready connection to "ground" which in theory has no noise. However, the way in which the ground planes were treated in the prior art was relatively deficient.

One attempted RF shielded enclosure is shown in U.S. Pat. No. 4,658,334 to McSparran. This technique provides an RF shield around the circuit board at top and bottom and also shows putting an RF shield 104 on the edges of the multi-layer board. The RF shield on the edges, however, does not necessarily make good contact with these edges. Moreover, the shielding enclosure of McSparran is complicated as it must be located on top and bottom and must be screwed and unscrewed in order to reach the board.

Another attempted solution is shown in U.S. Pat. No. 3,179,913 to Mittler. FIG. 21 of Mittler shows a multi-layer matrix board which uses edges formed of a ground plane in order to attempt to shield the device. A plurality of these devices are located in racks, and multiple layers of the board are held together by screws. Therefore this system is hard to use. It is an object of the present invention to provide an easy-to-assemble and use system which enables ready access to the components on the circuit board but yet provides a maximum shielding for the circuit board.

SUMMARY OF THE INVENTION

The present invention proposes a special multi-layer circuit board. Each layer except the top and bottom layer have edges which define a ground plane for the component traces on the board. The top and bottom layers are used as connecting planes and include components, connectors and the like. The board also has a shielded area within which the sensitive components are located. The shielded layer is formed with a number of shielding holes that are plated-through, between every layer of the multiple layers of the board. Each of the shielding holes are used to hold tabs of a shielding assembly.

The shielding assembly is formed of tin or nickel-plated brass, or any other material to which solder can easily be applied having extending tabs, each connected to one of the shielding holes. The shield completely surrounds the shielding area. The shielding assembly can be formed with at least one hole through which a status of the components can be determined, an adjustment can be made using an appropriate tool, and/or connection to the circuits can be performed.

The conductive shielding assembly is connected to the ground planes of all of the multi-layer boards of the assembly. Moreover, an edge plating is provided between the multi-layer boards in order ensure maximum connection between the ground planes and to eliminate "ground loops". Finally, an external connector is provided, removed from the shielded area. This external connector is connected through the multi-layer boards to a filter and isolation area. The signals entering the shielded area are isolated, for instance by optoisolators, and filtered in order to ensure that noise on these signals does not correspondingly enter the shielded area. This also ensures that a ground isolation is maintained between the various signals and the components.

BRIEF DESCRIPTION OF THE DRAWINGS

These and other advantages will now be described with reference to the accompanying drawings wherein:

FIG. 1 shows an embodiment of the invention including all of the various components located thereon, from a top view including two partial broken-away portions showing components underneath;

FIG. 2 shows a side view of this embodiment;

FIG. 3 shows a closeup of the edge of the board of this embodiment;

FIGS. 4A and 4B illustrate perspective views of first and second embodiments of the shielding assembly in its open position;

FIG. 4C shows a close up of the folding and bonding according to the first embodiment;

FIG. 5 shows a connection between the shielding assembly and the circuit board;

FIG. 6D shows a representative layout of one of the interior multi-layer boards of the present invention.

DESCRIPTION OF THE PRESENTLY PREFERRED EMBODIMENT

Figure 6A:
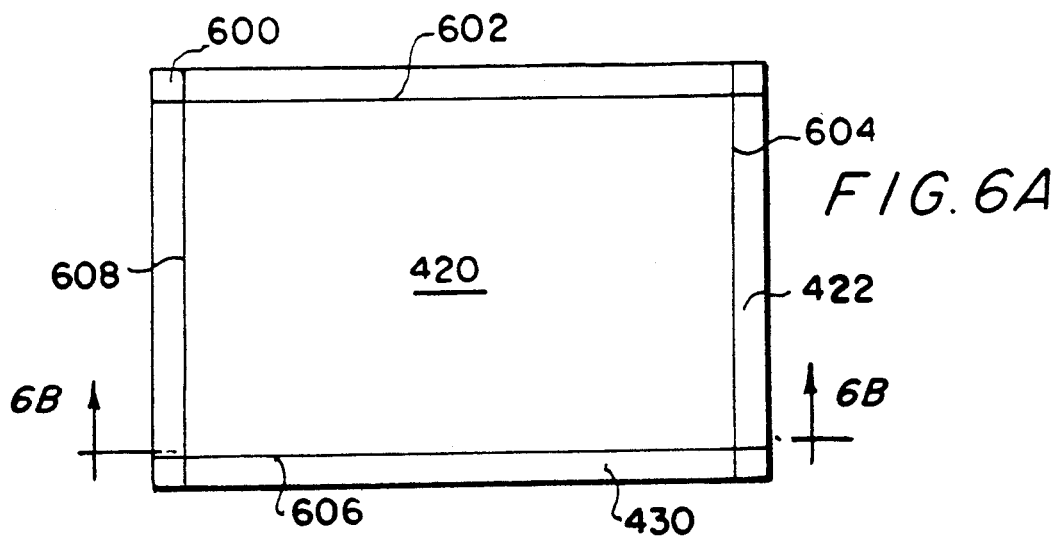
FIGS. 6A-6C shows steps of producing the shielding assembly of the present invention.

A presently preferred embodiment will now be described with reference to the accompanying drawings. FIG. 1 shows a top view of the preferred embodiment of this invention. This embodiment is formed of a shielded, multi-layer circuit board including a shielding assembly and other associated structure. The multi-layer board 100 is formed with a plurality of shielding holes 102. For clarity of the drawing, not all shielding holes 102 are labelled, but some representative ones of the shielding holes are labelled. Shielding holes 102 receive tabs 104, shown in FIGS. 2 and 5, of a shielding assembly 110.

Shielding assembly 110 is formed of a rectangular box of tin or nickel-plated brass open at the bottom 440 and closed by top 410 and having corner edges 112, and sides 114 and 142. FIG. 4A shows a first embodiment of shielding assembly 110 in a partially cut away view. This first embodiment forms the box as a two piece shielding unit including a perimeter 442 and a top or fence 410. The two pieces are attached together using metal tape 402. The perimeter 442 is formed by bending sheet metal to form four side pieces 404 formed as a rectangle, and to form a lip 406 extending around the top portion (the portion that will be closed) of the rectangle. Before the fence 410 is placed on the perimeter, therefore, it has an open area 408 bounded a lip 406 which extends into the open area.

In order to close the box, top 410 is placed on the box, and secured on the box around the four ends with metal tape 402. The metal tape is adhered to the top 410 and each of the four sides 404. A close up of the bonding is shown in FIG. 4C and shows how top 410 rests on lip 406.

One advantage of this embodiment is that the top 410 can be removed, if necessary, to obtain access to the components by cutting the metal tape. However, this embodiment has the disadvantage of requiring assembly of the device. The second embodiment of FIG. 4B forms a shield of a one piece construction. The top portion of the shield 420 is attached to side pieces 422, after locating side pieces 422 by bending these side pieces away from the top portion of the shield. If necessary, spot welds may be located at the corners 424.

FIG. 1 shows connector 130 disposed spaced from the shielding assembly 110, through which input and output connections with the circuit board are made. Signals to and from connector 130 are coupled through connector 130 to traces formed in the multi-layer board beneath connector 130. These signals are connected via these traces to isolator filter bank 140, which is located within shielding assembly 110 at a location most closely adjacent to connector 130. Isolator filter bank 140 isolates between the input and output signals using, for example, optoisolator assemblies and noise filtration techniques. Once isolated and filtered, these signals are connected through the multi-layer traces to the circuitry within shielding assembly 110 This circuitry is shown generally as 160 in FIG. 1, it being understood that any type of circuitry could be used therein.

Circuitry may also provided on the board 100 outside of the shielding assembly 110.

Various holes may also be formed in the shielding assembly as shown in FIG. 1. One hole that may be formed is hole 122 adapted to allow status LED 120 to be seen through it. In addition, signal holes as shown by elements 170 and 172. These holes allow connections of optical cable directly to optically sensitive elements within the device.

FIG. 2 shows a side view of the circuit board, as seen from the direction 2 in FIG. 1. This side view shows the conductive tape 402, and side 404. The edge of circuit board 100 is shown as being plated over at all areas except for notch areas 220. Each notch area 220, is of the length of ¼ a wavelength. At all other areas, the ground planes of the interior layers of the multi-layer board are connected to one another by edge plating the circuit board.

In order to facilitate explanation of this edge connection better, a representative layer of the multi-layer board is shown in FIG. 6. The perimeter of the entire layer is a ground plane 230. This ground plane 230 is connected to the ground of the system, and surrounds a connection area 240 within which traces to connect various points on the circuit board to various other points are located. If a particular hole 242 is being used in the particular layer, it will be plated around, and connected via a trace 246 to another hole 241.

The edges 232 of ground area 230 are exposed at the edge of the circuit board which is plated over by plating 205 shown in FIG. 2. The shielded area of the board will also be surrounded by plated-through holes 102 on each layer of the board.

FIG. 3 shows a close-up of area 3 in FIG. 2. This close-up shows the plated area 205 which is covered by plating, and which makes electrical connection with a plurality of layers. The notch 220 is also shown in FIG. 3. FIG. 3 shows a multi-layer board which has three interior layers. Each of these interior layers provides edge surfaces 232 of the ground area 230. These edge surfaces are connected together by plating 205 which itself is connected to the tabs 104 of the shielding assembly 110. Therefore, the shielding assembly 110 is also advantageously grounded to these ground planes.

This grounding technique of grounding at many points prevents the phenomenon known in the art as "ground loops" from occurring. Ground loops occur when a ground potential is connected at one point, and at a long distance from that one point. Because no ground plane has a perfect zero resistance, there will be some voltage drop across the resistance along the ground plane. The voltage drop will cause the ground potential at one spot to be different from the voltage at other spots, thus causing a voltage potential difference. If the voltage at one spot is considered ground, and at the other spot is considered ground, there will two different voltage potentials, both of which are ground. This is known as a ground loop. The shielding techniques and ground connections of the present invention tend to ensure that such ground loops will be minimized.

FIG. 5 shows a detail of the connection between the tabs 104 of the shielding assembly 110 and the holes 102 formed in circuit board 100.

The fabrication of the circuit board is an especially important part of the present invention. An object of the invention is to make a circuit board which has optimal characteristics and yet is still easy to assemble. In order to do this, it is desirable to fabricate the shields with a high degree of accuracy, so that the tabs 104 of the shield are accurately aligned with the holes 102 making it a simple matter to insert these tabs. As stated previously, the tabs are located with a distance of a quarter wavelength between each tab. The plated-through holes are also relatively small, thereby making the accuracy of the actual shape of the box that forms the shield very important.

However, the way in which the prior art has folded boxes for shields is also relatively inaccurate.

The assembly technique of the shield of the present invention has been specially formulated in recognition of this problem.

Figure 6B:
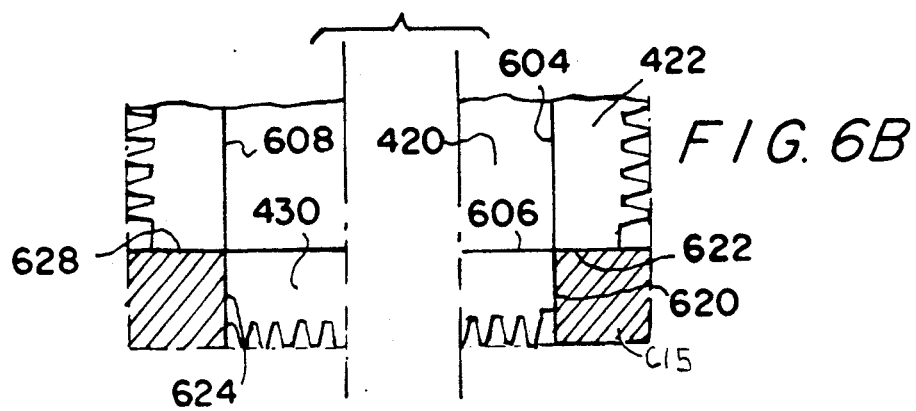

The assembly technique of the present invention begins with a flat sheet of appropriate metal, either tin or nickel-plated brass. This flat sheet is shown in FIG. 6A. Before any folding, this sheet is chemically etched by forming a computer aided drafting artwork template. This computer aided drafting artwork template shows the bends and folds which are necessary to form the box shown in FIG. 4A or 4B. For simplicity, the device formed will be the one shown in FIG. 4B. The computer aided drafting template is used to form grooves on flat sheet 600, including grooves 602, 604, 606 and 608. These grooves are precisely located at the precise locations which are necessary in order for the box, when folded to precisely fit onto the circuit board. At this point, however, no tabs are yet formed. The tabs are formed as shown in FIG. 6B which shows only a section of FIG. 6A below the line 6B, 6B in FIG. 6A. This section shows the second phase of the scoring which is done using the computer aided drafting artwork. This second etching process etches the hatched area shown in FIG. 6B and also etches away material to form the plurality of tabs 104.

The etching in FIG. 6B leaves tabs 104 extending. Also, the portion labeled 615 is removed so that an accurate fold can be made.

Figure 6C:
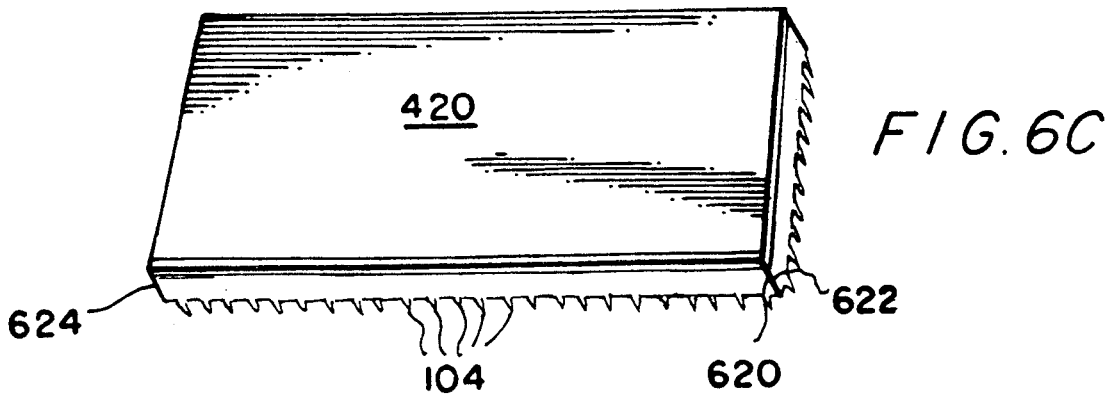

The result after folding the assembly of FIG. 6B is shown in FIG. 6C. The edge 620 of fold 604 is abutted against the edge 622 of fold 606. Similarly, the edge 624 abuts against edge 628. This equivalently forms the box structure shown in FIG. 6C with tabs 104 extending downward, and having exact, and more importantly highly reproducible, locations of folds and tabs. Therefore, all boxes will be the same as all others.

Finally, the purpose of the breaks in the edge plating will now be described. In order to plate the edges of the circuit board, it is necessary to dip the circuit board to allow these edges to come in contact with a plating solution. In order to do this, however, the circuit board must be held. The locations at which the circuit board is held therefore would not be plated with a solution.

It has been found by the inventors that forming each break such that it has a length of substantially a quarter of a wavelength of an operating frequency minimizes the noise allowed by the breaks.

Although only a few embodiments have been described above, those of ordinary skill in the art will certainly understand that many modifications are possible in this embodiment without departing materially from the teachings given herein. For example, although metal tape has been described as being the closure material, other closures are possible, including welds or solder. Although only one external connector has been shown, many such connectors may be provided. These and other modifications which would be appreciated by those having ordinary skill in the art and are intended to be encompassed within the following claims.

What is claimed is:

1. A method of forming a shield assembly to locate on a circuit board which includes a plurality of holes for accepting tabs of said shield assembly, said plurality of holes located on said circuit board at an area which is around a perimeter of the shield assembly, said method comprising the steps of:

providing a substantially flat piece of metal which will be used to form the shield assembly;

obtaining a template having locations of folds and tabs on said flat piece of metal, said folds being at locations to enable said tabs to be located in said plurality of holes on said circuit board;

using said template to etch grooves for folding in the flat piece of metal; and using said template to etch tabs in the flat piece of metal.

2. A method as in claim 1 comprising the further step of folding said metal along said grooves.

3. A method as in claim 2 comprising the further step of etching locations to form edges which abut against one another after folding.

* * * * *